United States Patent
Ji et al.

(10) Patent No.: US 10,310,983 B2
(45) Date of Patent: Jun. 4, 2019

(54) DATA STORAGE DEVICE AND OPERATING METHOD THEREOF

(71) Applicant: SK hynix Inc., Gyeonggi-do (KR)

(72) Inventors: Seung Gu Ji, Seoul (KR); Byeong Gyu Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/837,600

(22) Filed: Dec. 11, 2017

(65) Prior Publication Data

US 2018/0276136 A1    Sep. 27, 2018

(30) Foreign Application Priority Data

Mar. 23, 2017  (KR) .................. 10-2017-0036701

(51) Int. Cl.
| G11C 7/00 | (2006.01) |
| G06F 12/0891 | (2016.01) |
| G11C 7/12 | (2006.01) |
| G11C 16/26 | (2006.01) |
| G11C 7/22 | (2006.01) |
| G11C 7/10 | (2006.01) |
| G11C 11/4091 | (2006.01) |

(52) U.S. Cl.
CPC ........ G06F 12/0891 (2013.01); G11C 7/1051 (2013.01); G11C 7/12 (2013.01); G11C 7/22 (2013.01); G11C 11/4091 (2013.01); G11C 16/26 (2013.01)

(58) Field of Classification Search
CPC .. G06F 12/0253; G06F 3/0679; G06F 3/0625; G06F 3/0619; G06F 11/1016; G06F 3/065; G11C 7/22; G11C 7/1051; G11C 7/12; G11C 11/4091; G11C 16/26
See application file for complete search history.

(56) References Cited

U.S. PATENT DOCUMENTS

| 7,663,933 B2 | 2/2010 | Tsukazaki et al. | |
| 2015/0106573 A1* | 4/2015 | Yi | G06F 3/0658 |
| | | | 711/148 |
| 2018/0143902 A1* | 5/2018 | Hong | G06F 12/0253 |

FOREIGN PATENT DOCUMENTS

KR    1020110095104    8/2011

* cited by examiner

*Primary Examiner* — Pho M Luu
(74) *Attorney, Agent, or Firm* — IP & T Group LLP (57) ABSTRACT

An operating method for a data storage device may include: reading data from a first memory region of a storage medium; storing the read data in a data buffer; and writing the data stored in the data buffer to a second memory region of the storage medium, based on a read count for the first memory region.

18 Claims, 6 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0036701, filed on Mar. 23, 2017, which is herein incorporated by reference in its entirety.

BACKGROUND

1. Technical Field

Various embodiments generally relate to a data storage device, and more particularly, to a data storage device including a nonvolatile memory device.

2. Related Art

Data storage devices may store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, an operating method for a data storage device may include: reading data from a first memory region of a storage medium; storing the read data in a data buffer; and writing the data stored in the data buffer to a second memory region of the storage medium, based on a read count for the first memory region.

In an embodiment, an operating method for a data storage device may include: determining whether a read count value of a memory region included in a storage medium exceeds a threshold count value; and whenever a read request for the memory region is received from an external device, writing read-requested data stored in the memory region to another memory region included in the storage medium, depending on the determination result.

In an embodiment, a data storage device may include: a storage medium including a plurality of memory regions; and a controller including a data buffer. The controller may read data from a first memory region of a storage medium, store the read data in a data buffer, and write the data stored in the data buffer to a second memory region of the storage medium, based on a read count value for the first memory region.

In an embodiment, a data storage device may include: a storage medium comprising a plurality of memory regions; and a controller suitable for reading original data stored in a memory region of the storage medium in response to a read request received from an external device, increasing a read count value of the memory region, determining whether the read count value exceeds a threshold count value, and invalidating the original data among data stored in the memory region, depending on the determination result.

In an embodiment, a data storage device may include: a storage medium including a plurality of memory regions; and a controller suitable for determining whether a read count value of a memory region included in the storage medium exceeds a threshold count value, and writing data stored in the memory region and corresponding to a read request to another memory region included in the storage medium whenever receiving the read request for the memory region from an external device, depending on the determination result.

In an embodiment, an operating method of a data storage device may include: reading original data stored in a memory region of a storage medium, in response to a read request received from an external device; increasing a read count value of the memory region; determining whether the read count value exceeds a threshold count value; and invalidating the original data among data stored in the memory region, depending on the determination result.

In an embodiment, the invalidating of the original data may include, invalidating, depending on the determination result, valid data stored in the memory region after receiving a read request indicating a read operation for the valid data.

In an embodiment, the operating method of a data storage device may further include writing data read from the original data to another memory region of the storage medium, depending on the determination result.

In an embodiment, the operating method of a data storage device may further include transmitting data read from the original data to the external device in response to the read request.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

Figure 1:
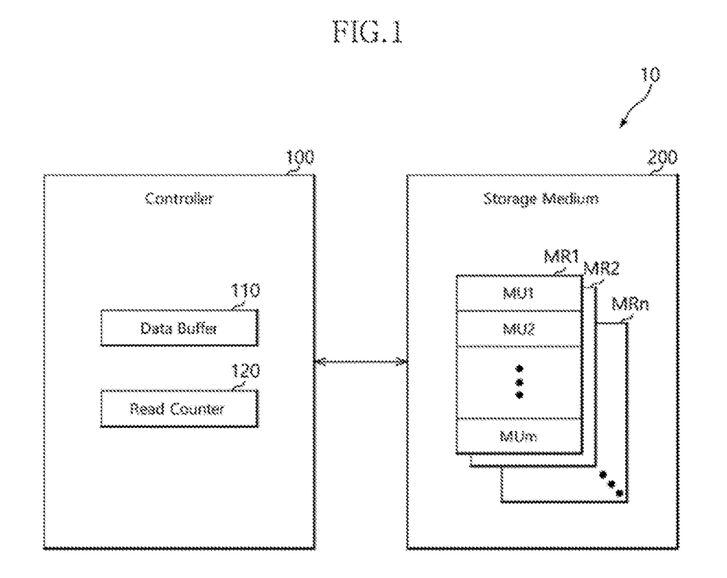
FIG. 1 is a block diagram illustrating a data storage device in accordance with an embodiment of the present invention.

FIG. 1 is a block diagram illustrating a data storage device 10 in accordance with an embodiment.

The data storage device 10 may be configured to store data provided from an external device, in response to a write request of the external device. Also, the data storage device 10 may be configured to provide the stored data to the external device, in response to a read request of the external device.

The data storage device 10 may be prepared in the form of a Personal Computer Memory Card International Association (PCMCIA) card, a Compact Flash (CF) card, a smart media card, a memory stick, various multimedia cards (for example, MMC, eMMC, RS-MMC, and MMC-Micro), various secure digital cards (for example, SD, Mini-SD, and Micro-SD), a Universal Flash Storage (UFS), a Solid State Drive (SSD) and the like.

The data storage device 10 may include a controller 100 and a storage medium 200. The controller 100 may include a data buffer 110 and a read counter 120. The storage medium 200 may include a plurality of memory regions MR1 to MRn.

The controller 100 may control overall operations of the data storage device 10. The controller 100 may store data in the storage medium 200 in response to a write request received from the external device, or read data stored in the storage medium 200 and output the read data to the external device, in response to a read request received from the external device.

The controller 100 may perform a data transfer operation on a memory region where data loss is likely to occur due to an excessive number of read operations, among the plurality of memory regions MR1 to MRn included in the storage medium 200. When the read count value of the memory region exceeds a threshold count value, it may indicate that data of the memory region are likely to be lost. The data which are likely to be lost may be refreshed through a data transfer operation. In particular, the controller 100 may perform the data transfer operation whenever a read request of the external device is received, thereby minimizing read operations which increase an operation cost and cause a data loss.

Specifically, the controller 100 may read data from a memory region of the storage medium 200, for example, the memory region MR1, and store the read data in the data buffer 110, in response to a read request received from the external device. The controller 100 may transmit the data stored in the data buffer 110 to the external device, in order to process the read request. Furthermore, the controller 100 may increase the read count value of the memory region MR1 where the read operation was performed through the read counter 120, and determine whether the read count value exceeds the threshold count value. The controller 100 may write the data stored in the data buffer 110 to another memory region of the storage medium 200, for example, the memory region MR2, depending on the determination result. Specifically, when the read count value does not exceed the threshold count value, the data transfer operation may not be performed. However, when the read count value exceeds the threshold count value, the controller 100 may write the data stored in the data buffer 110 to another memory region of the storage medium 200.

After writing the data stored in the data buffer 110 to the memory region MR2, the controller 100 may invalidate the original data on which the read operation was performed, that is, the original data stored in the memory region MR1. At this time, the controller 100 may invalidate only the original data transferred to the memory region MR2, among the data stored in the memory region MR1. The other data stored in the memory region MR1 may retain the existing valid or invalid state. As described later, the read operation of the storage medium 200 may be performed on a memory unit basis. For example, when data stored in the memory unit MU1 are transferred to the memory region MR2, only the original data stored in the memory unit MU1 may be invalidated, and data stored in the other memory units MU2 to MUm may retain the existing valid or invalid state. The valid data remaining in the memory region MR1 may be read in response to a read request when the read request indicating a read operation for the corresponding data is received from the external device, transferred to another memory region, for example, the memory region MR2, and then invalidated.

When the read count value of the memory region MR1 starts to exceed the threshold count value, the data transfer operation for the memory region MR1 may be performed whenever a read request for the memory region MR1 is received afterwards. The data transfer operation for the memory region MR1 may be performed until no more valid data remain in the memory region MR1. A specific method in which the controller 100 performs a data transfer operation will be described in detail with reference to FIG. 4.

The data buffer 110 may temporarily store data transmitted and/or received between the external device and the storage medium 200. In the present embodiment, the data buffer 110 may temporarily store data read from a memory region of the storage medium 200 in response to a read request of the external device, until the data are written to another memory region depending on the read count value of the memory region.

The read counter 120 may manage the read counts of the respective memory regions MR1 to MRn. The read counter 120 may increase the read count value of a memory region where a read operation was performed in response to an external request. As described later, when the read operation is performed on a memory unit basis, the read counter 120 may increase the read count value of a memory region including a memory unit where the read operation was performed.

The storage medium 200 may store data received from the controller 100, or read data stored therein and transmit the read data to the controller 100, according to control of the controller 100. The storage medium 200 may include the plurality of memory regions MR1 to MRn. Each of the memory regions MR1 to MRn may include memory units MU1 to MUm. Each of the memory units may correspond to the unit where the read operation is performed. When a read operation is performed, data stored in one memory unit may be read at the same time.

The storage medium 200 may include one or more nonvolatile memory devices. The nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

Figure 2:
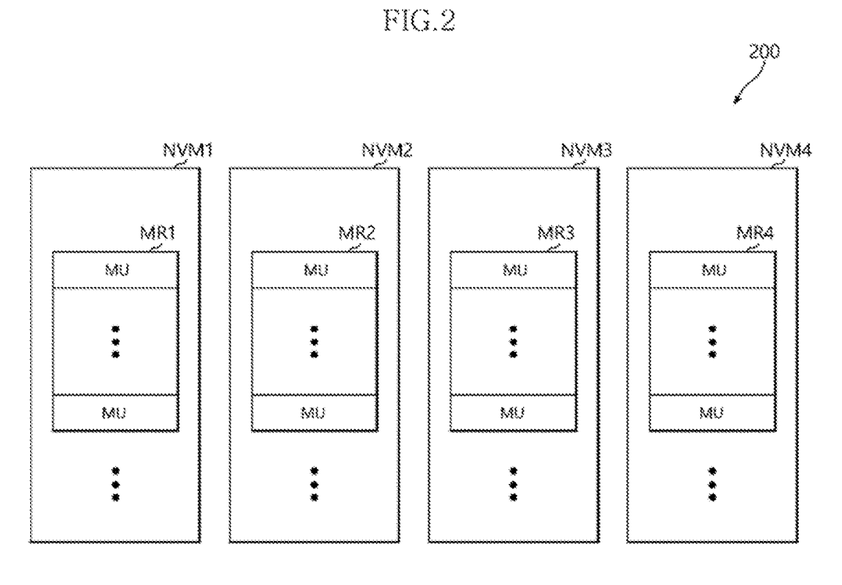
FIG. 2 is a diagram illustrating a storage medium shown in FIG. 1.

FIG. 2 is a diagram illustrating a storage medium in accordance with an embodiment of the present invention, for example, the memory regions MR1 to MRn included in the storage medium 200 of FIG. 1.

Referring to FIG. 2, when the storage medium 200 includes a plurality of nonvolatile memory devices, for example, four nonvolatile memory devices NVM1 to NVM4, the memory regions MR1 to MRn, for example, the memory regions MR1 to MR4 may be uniformly distributed in the nonvolatile memory devices NVM1 to NVM4. Each of the memory regions MR1 to MRn may correspond to the unit where the nonvolatile memory device performs an erase operation. The nonvolatile memory device may perform an erase operation to erase data stored in one memory region at the same time.

Figure 3:
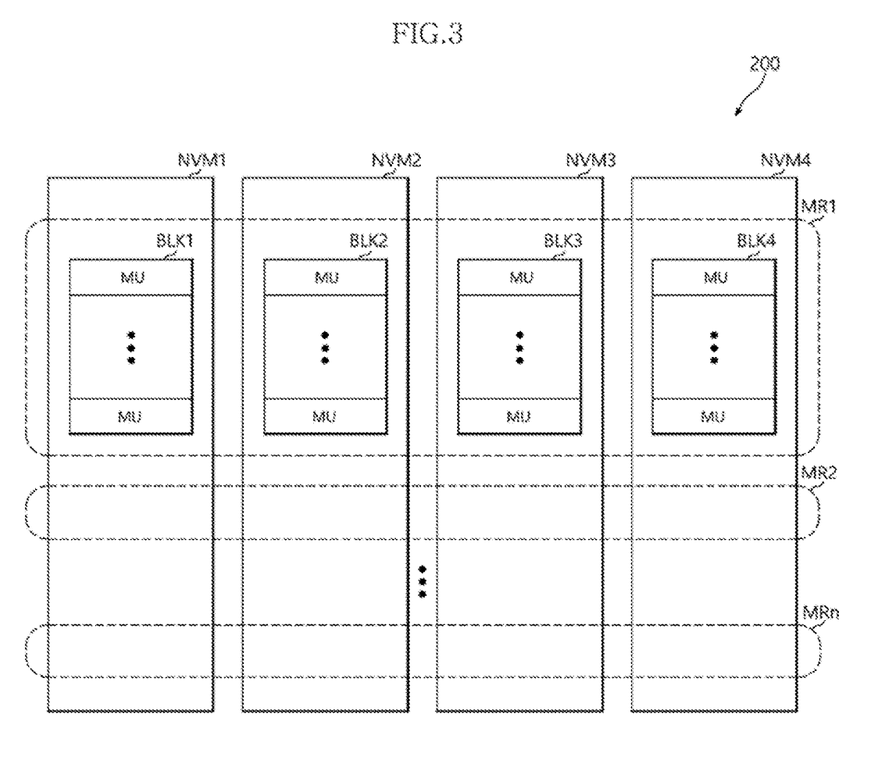
FIG. 3 is a diagram illustrating a storage medium shown in FIG. 1.

FIG. 3 is a diagram illustrating a storage medium accordance with an embodiment of the present invention, for example, the memory regions MR1 to MRn included in the storage medium 200 of FIG. 1.

Referring to FIG. 3, when the storage medium 200 includes four nonvolatile memory devices NVM1 to NVM4, each of the memory regions MR1 to MRn may be present across the nonvolatile memory devices NVM1 to NVM4, unlike the configuration illustrated in FIG. 2. Specifically, a single memory region, for example, the memory region MR1 may include memory blocks BLK1 to BLK4 included in the respective nonvolatile memory devices NVM1 to NVM4. Each of the memory blocks BLK1 to BLK4 may correspond to the unit where the nonvolatile memory device performs an erase operation. Each of the memory blocks BLK1 to BLK4 may include a plurality of memory units MU. FIG. 3 illustrates that the memory region MR1 includes one memory block in each of the nonvolatile memory devices NVM1 to NVM4. In another embodiment, however, each of the memory regions MR1 to MRn may include a plurality of memory blocks in each of the nonvolatile memory devices NVM1 to NVM4.

Figure 4:
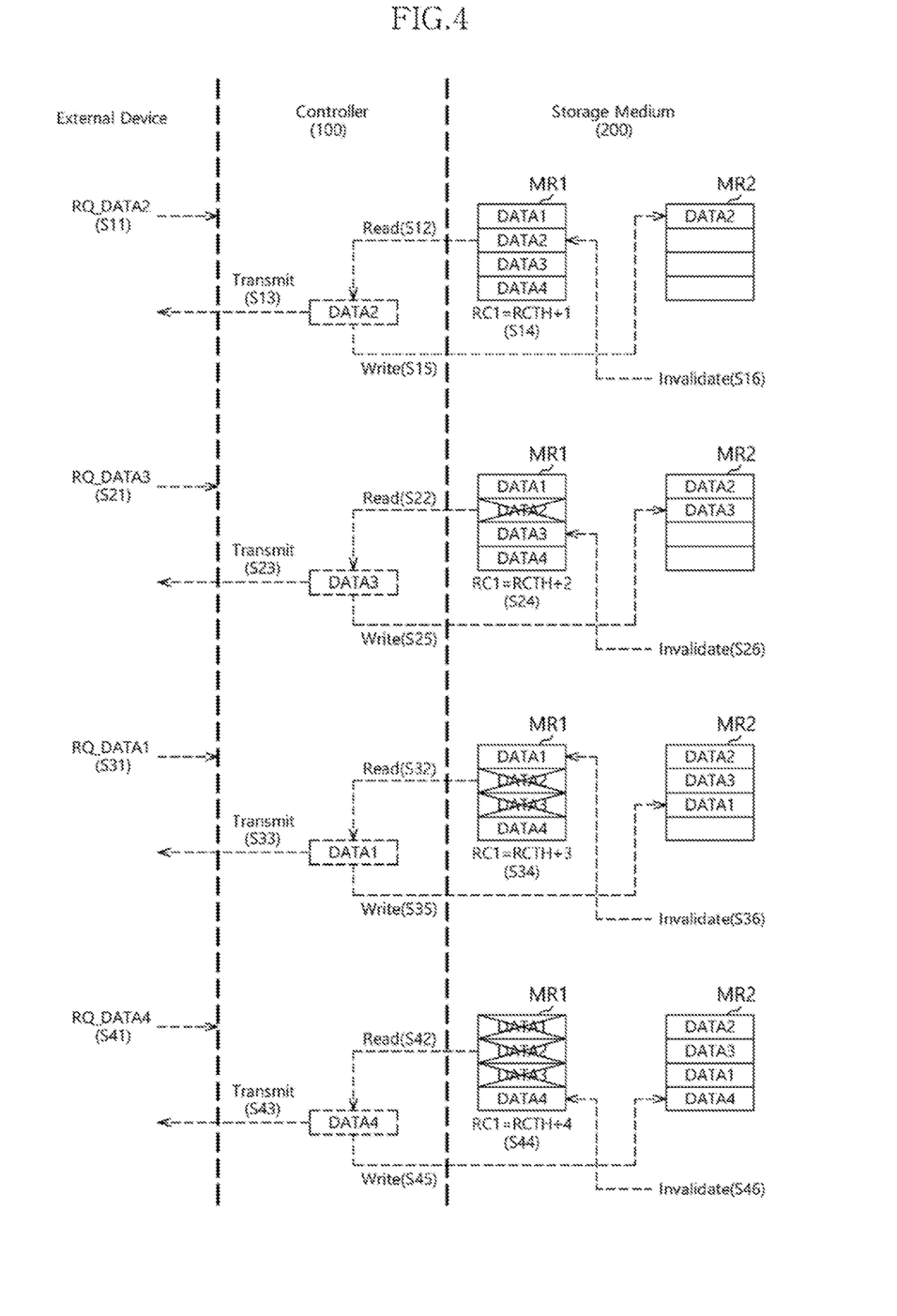
FIG. 4 is a diagram illustrating an operating method of a data storage device shown in FIG. 1.

FIG. 4 is a diagram illustrating an operating method of a data storage device in accordance with an embodiment of the present invention, for example, an operating method of the data storage device 10 of FIG. 1. In FIG. 4, each of the memory regions MR1 and MR2 may include four memory units represented by rectangles, for example.

Referring to FIG. 4, at step S11, the controller 100 may receive a read request RQ_DATA2 from the external device. The read request RQ_DATA2 may request data DATA2 stored in the memory region MR1 of the storage medium 200. At step S12, the controller 100 may read the data DATA2 from the memory region MR1 in response to the read request RQ_DATA2. At step S13, the controller 100 may transmit the read data DATA2 to the external device. At this time, the controller 100 may store the read data DATA2 in the data buffer 110 before transmitting the read data DATA2 to the external device.

At step S14, the controller 100 may increase the read count value RC1 of the memory region MR1 based on the read operation for the data DATA2. The controller 100 may determine whether the read count value RC1 of the memory region MR1 exceeds a threshold count value RCTH. When the read count value RC1 of the memory region MR1 does not exceed the threshold count value RCTH, the data DATA2 may be retained as valid data in the memory region MR1, As illustrated in FIG. 4, however, when the read count value RC1 of the memory region MR1 becomes "RCTH+1" by the data read operation of the data DATA2 at step S12 and thus exceeds the threshold count value RCTH, the controller 100 may write the data DATA2 stored in the data buffer 110 to the memory region MR2 at step S15. That is, to transfer the data DATA2 from the memory region MR1 to the memory region MR2, the controller 100 may use the data DATA2 stored in the data buffer 110 without reading the original data DATA2 from the memory region MR1.

After writing the data DATA2 to the memory region MR2, the controller 100 may invalidate the original data DATA2 stored in the memory region MR1 at step S16. At this time, since the controller 100 invalidates only the original data DATA2, the other data DATA1, DATA3 and DATA4 stored in the memory region MR1 may retain the existing valid or invalid state. In the embodiment of FIG. 4, the other data DATA1, DATA3 and DATA4 may be valid data.

Therefore, if a read request for the data DATA2 is received from the external device afterwards, the controller 100 may read the data DATA2 from the memory region MR2, and transmit the read data DATA2 to the external device. That is, the memory region MR1 may not be affected by the read operation for the data DATA2 after step S16.

When the read operation for the data DATA2 has been frequently performed since the data DATA2 are hot data, the damage of the data DATA1 to DATA4 stored in the memory region MR1 may have progressed. However, the read operation for the data DATA2 after step S16 no longer causes the damage of the other data DATA1, DATA3 and DATA4 stored in the memory region MR1.

After that, the controller 100 may perform a data transfer operation in response to a read request of the external device in substantially the same manner as the above-described operation. Before step S21 is described, the memory region MR1 may include the data DATA2 invalidated at step S16. In FIG. 4, "X" over the data DATA2 may represent that the data DATA2 are invalid data. The controller 100 may receive a read request RQ_DATA3 of the external device to request the data DATA3 at step S21, read the data DATA3 from the memory region MR1 at step S22, and transmit the read data DATA3 to the external device at step S23. At this time, the controller 100 may store the read data DATA3 in the data buffer 110 before transmitting the read data DATA3 to the external device.

At step S24, the controller 100 may increase the read count value RC1 of the memory region MR1 to "RCTH+2" based on the read operation for the data DATA3, and determine whether the read count value RC1 of the memory region MR1 exceeds the threshold count value RCTH. Since the read count value RC1 of the memory region MR1 already exceeded the threshold count value RCTH at step S14, the read count value RC1 will obviously exceed the threshold count value RCTH afterwards. Therefore, the controller 100 may write the data DATA3 stored in the data buffer 110 to the memory region MR2 at step S25. At step S26, the controller 100 may invalidate the original data DATA3 stored in the memory region MR1. The other data DATA1, DATA2 and DATA4 stored in the memory region MR1 may retain the existing valid or invalid state.

Before step S31 is described, the memory region MR1 may include the invalidated data DATA2 and DATA3 at step S26. The controller 100 may receive a read request RQ_DATA1 from the external device to request the data DATA1 at step S31, read the data DATA1 from the memory region MR1 at step S32, and transmit the read data DATA1 to the external device at step S33. At this time, the controller 100 may store the read data DATA1 in the data buffer 110 before transmitting the read data DATA1 to the external device.

At step S34, the controller 100 may increase the read count value RC1 of the memory region MR1 to "RCTH+3" based on the read operation for the data DATA1, and determine whether the read count value RC1 of the memory region MR1 exceeds the threshold count value RCTH. Since the read count value RC1 exceeds the threshold count value RCTH, the controller 100 may write the data DATA1 stored in the data buffer 110 to the memory region MR2 at step S35. At step S36, the controller 100 may invalidate the original data DATA1 stored in the memory region MR1. The other data DATA2, DATA3 and DATA4 stored in the memory region MR1 may retain the existing valid or invalid state.

Before step S41 is described, the memory region MR1 may include the invalidated data DATA1 to DATA3 at step S36. The controller 100 may receive a read request RQ_DATA4 of the external device to request the data DATA4 at step S41, read the data DATA4 from the memory region MR1 at step S42, and transmit the read data DATA4 to the external device at step S43. At this time, the controller 100 may store the read data DATA4 in the data buffer 110 before transmitting the read data DATA4 to the external device.

At step S44, the controller 100 may increase the read count value RC1 of the memory region MR1 to "RCTH+4" based on the read operation for the data DATA4, and determine whether the read count value RC1 of the memory region MR1 exceeds the threshold count value RCTH. Since the read count value RC1 exceeds the threshold count value RCTH, the controller 100 may write the data DATA4 stored in the data buffer 110 to the memory region MR2 at step S45. At step S46, the controller 100 may invalidate the original data DATA4 stored in the memory region MR1. The other data DATA1 to DATA3 stored in the memory region MR1 may retain the existing invalid state.

At this time, the read count value RC1 of the memory region MR1 may increase up to a "threshold count value RCTH+total number (4) of memory units included in memory region". Therefore, the threshold count value RCTH may be determined in consideration of the point of time that the data stored in the memory region MR1 are damaged by a plurality of read operations. That is, the threshold count value RCTH may be set in such a manner that the data stored in the memory region MR1 can be transferred to the memory region MR2 before being damaged. For example, when certain data stored in the memory region MR1 start to be damaged into uncorrectable data after a read operation for the data stored in the memory region MR1 was repeated a specific number of times in an extreme case, the desirable maximum count of the read count value RC1 needs to be set to a smaller value than the specific number of times. The threshold count value RCTH may be set by subtracting the total number of memory units included in the memory region MR1, that is, "4" from the maximum count that satisfies the condition.

Since the memory region MR1 stores no more valid data after step S46, the controller 100 may perform an erase operation on the memory region MR1.

At steps S15, S25, S35 and S45, the write operation is performed only on the memory region MR2. In another embodiment, however, the controller 100 may write the data DATA1 to DATA4 to two or more other memory regions at steps S15, S25, S35 and S45.

Figure 5:
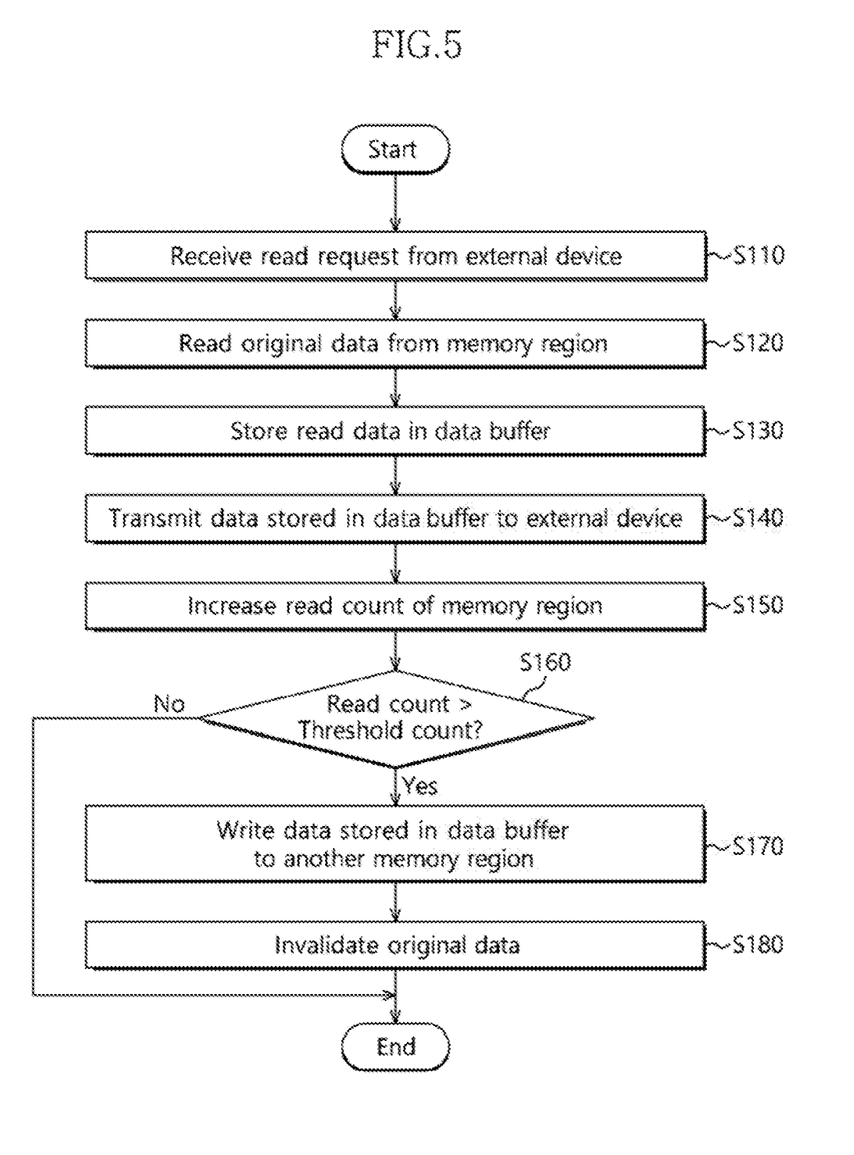
FIG. 5 is a flowchart illustrating an, operating method of a data storage device shown in FIG. 1.

FIG. 5 is a flowchart illustrating an operating method for a data storage device in accordance with an embodiment of the present invention, for example, an operating method for the data storage device 10 of FIG. 1.

Referring to FIG. 5, the controller 100 may receive a read request for data stored in a predetermined memory region of the storage medium 200 from the external device at step S110.

At step S120, the controller 100 may read the original data from the memory region of the storage medium 200 in response to the read request.

At step S130, the controller 100 may store the read data in the data buffer 110.

At step S140, the controller 100 may transmit the data stored in the data buffer 110 to the external device.

At step S150, the controller 100 may increase the read count value of the memory region where the read operation was performed.

At step S160, the controller 100 may determine whether the read count value of the memory region where the read operation was performed exceeds the threshold count value. When the read count value exceeds the threshold count value, the procedure may proceed to step S170. When the read count value does not exceed the threshold count value, the procedure may be ended.

At step S170, the controller 100 may write the data stored in the data buffer 110 to another memory region of the storage medium 200. That is, the controller 100 may not perform an additional read operation on the original data on which the read operation was performed, in order to transfer the original data to another memory region.

At step S180, the controller 100 may invalidate the original data on which the read operation was performed. The other data excluding the original data in the memory region where the read operation was performed may retain the existing valid or invalid data.

The procedure of FIG. 5 may be performed whenever a read request is received from the external device. Therefore, when the read count value of a certain memory region exceeds the threshold count value and read requests for all data stored in the corresponding memory region are transmitted at least once, all of the data stored in the corresponding memory region may be transferred to another memory region.

In FIGS. 4 and 5, the operation of transmitting the read data to the external device may be performed immediately after the read data are stored in the data buffer 110, but the sequence of the transmission operation is not limited thereto. For example, the data transmission operation may be performed even after a write operation or invalidation operation.

In another embodiment, the controller 100 may perform the data transfer operation on a larger unit basis than the memory unit, whenever a read request of the external device is received. Specifically, when the read count value of the memory region corresponding to the read request exceeds the threshold count value in the embodiment in which the memory regions MR1 to MRn are configured as illustrated in FIG. 3, the controller 100 may perform the data transfer operation on a memory block selected from the corresponding memory region. The memory block where the data transfer operation is performed may correspond to a memory block that stores data read according to the read request in the corresponding memory region. The controller 100 may perform the data transfer operation by writing all valid data stored in the selected memory block to another memory block, and invalidating all of the valid data stored in the corresponding memory block. The other memory blocks excluding the memory block where the data transfer operation was performed in the corresponding memory region may retain the existing states. Furthermore, the controller 100 may perform the data transfer operation on a memory block in which data read according to a read request are stored, whenever the read request for the corresponding memory region is received.

Figure 6:
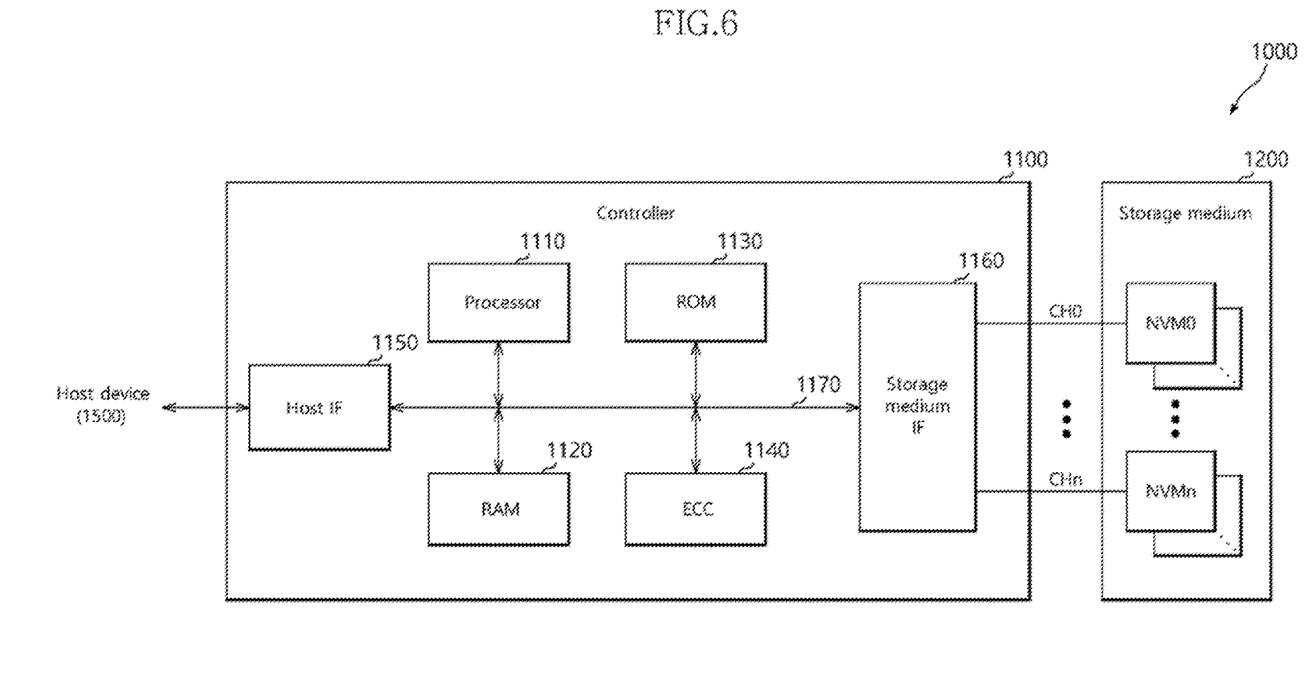
FIG. 6 is a block diagram illustrating a solid state drive (SSD) in accordance with an embodiment.

FIG. 6 is a block diagram illustrating a solid state drive (SSD) 1000 in accordance with an embodiment.

Referring to FIG. 6, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface (IF) 1150 and a storage medium interface (IF) 1160, which are connected through an internal bus 1170.

The controller 1100 may operate in substantially the same manner as the controller 100 illustrated in FIG. 1. The controller 1100 may store data read from a memory region of the storage medium 1200 in the RAM 1120 in response to a read request received from the external device. The controller 1100 may increase the read count value of the memory region of the storage medium 1200, where the read operation was performed, and determine whether the read count value exceeds the threshold count value, through a read counter (not illustrated). The controller 1100 may write the data stored in the RAM 1120 to another memory region of the storage medium 1200, depending on the determination result. The controller 1100 may invalidate the original data on which the read operation was performed. The other data of the memory region where the read operation was performed may retain the existing valid or invalid state.

The processor 1110 may control overall operations of the controller 1100. The processor 1110 may store data in the storage medium 1200 according to a data processing request of the host device 1500, and read the stored data from the storage medium 1200. The processor 1110 may control an internal operation of the SSD 1000, such as a merge operation or wear leveling operation, in order to efficiently manage the storage medium 1200.

The RAM 1120 may store programs and program data which are used by the processor 1110. The RAM 1120 may temporarily store data received from the host interface 1150 before the data are transferred to the storage medium 1200, and temporarily store read data from the storage medium 1200 before the data are transferred to the host device 1500. The RAM 1120 may operate in substantially the same manner as the data buffer 110 of FIG. 1.

The ROM 1130 may store a program code read by the processor 1110. The program code may include commands which are processed by the processor 1110 to control internal units of the controller 1100.

The ECC unit 1140 may encode data to be stored in the storage medium 1200, and decode data read from the storage medium 1200. The ECC unit 1140 may detect and correct an error in the data, according to an ECC algorithm.

The host interface 1150 may exchange data processing requests and data with the host device 1500.

The storage medium interface 1160 may transmit a control signal and data to the storage medium 1200. The storage medium interface 1160 may receive data from the storage medium 1200. The storage medium interface 1160 may be coupled to the storage medium 1200 through a plurality of channels CH0 to CHn.

The storage medium 1200 may include a plurality of nonvolatile memory devices NVM0 to NVMn. Each of the nonvolatile memory device NVM0 to NVMn may perform a write operation and read operation according to control of the controller 1100.

Figure 7:
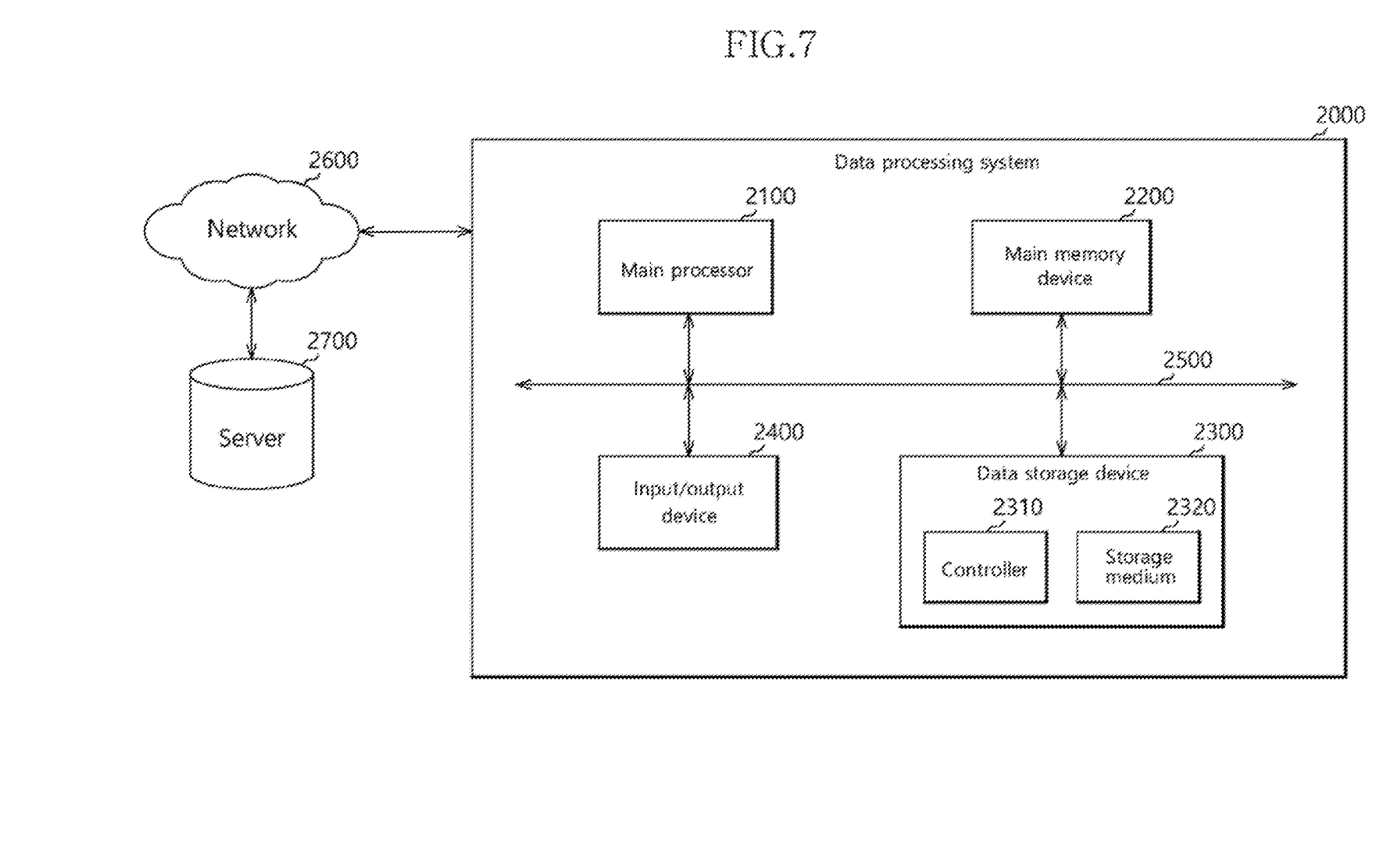
FIG. 7 is a block diagram illustrating a data processing system to which the data storage device in accordance with the present embodiment is applied.

FIG. 7 is a block diagram illustrating a data processing system 2000 to which the data storage device 10 of FIG. 1 in accordance with the present embodiment is applied.

Referring to FIG. 7, the data processing system 2000 may include a computer, laptop computer, netbook computer, smart phone, digital television (TV), digital camera, navigation system and the like. The data processing system 2000 may include a main processor 2100, a main memory device 2200, a data storage device 2300 and an input/output device 2400. The internal units of the data processing system 2000 may exchange control signals and data through a system bus 2500.

The main processor 2100 may control overall operations of the data processing system 2000. The main processor 2100 may include a central processing unit (CPU) such as a microprocessor, for example. The main processor 2100 may execute various pieces of software such as an operating system, application and device driver, on the main memory device 2200.

The main memory device 2200 may store programs and program data which are used by the main processor 2100. The main memory device 2200 may temporarily store data which are to be transmitted to the data storage device 2300 and the input/output device 2400.

The data storage device 2300 may include a controller 2310 and a storage medium 2320. The data storage device 2300 may be configured and operated in substantially the same manner as the data storage device 10 of FIG. 1.

The input/output device 2400 may include a keyboard scanner, touch screen, screen monitor, printer and mouse, which are capable of exchanging information with a user. For example, the input/output device 2400 may receive a command for controlling the data processing system 2000 from the user, or provide a processed result to the user.

Depending on an embodiment, the data processing system 2000 may communicate with one or more servers 2700 through a network 2600 such as local area network (LAN), wide area network (WAN) or wireless network. The data processing system 2000 may include a network interface (not illustrated) in order to connect to the network 2600.

While various embodiments have been described above, it will be understood to those skilled in the art that the embodiments described are examples only. Accordingly, the data storage device and the operating method thereof described herein should not be limited to the described embodiments. It will be apparent to those skilled in the art to which the present invention pertains that various other changes and modifications may be made without departing from the spirit and scope of the invention as defined in the following claims.

What is claimed is:

1. An operating method of a data storage device, comprising:
   reading data from a first memory region of a storage medium;
   storing the read data in a data buffer; and
   writing the data stored in the data buffer to a second memory region of the storage medium, based on a read count for the first memory region.

2. The operating method of claim 1, further comprising:
   determining a read count value for the first memory region; and
   comparing the read count value for the first memory region with a threshold value,
   wherein the writing of the data stored in the data buffer comprises the data stored in the data buffer to the second memory region of the storage medium, based on the comparison result.

3. The operating method of claim 1, further comprising invalidating original data stored in the memory region, after the writing of the data.

4. The operating method of claim 3, wherein states of other data stored in the memory region are retained when the original data are invalidated.

5. The operating method of claim 1, further comprising transmitting the data stored in the data buffer to the external device in response to the read request.

6. The operating method of claim 1, further comprising performing a data transfer operation on a memory block in which the read data are stored, among a plurality of memory blocks included in the memory region, depending on the determination result.

7. The operating method of claim 6, wherein when the data transfer operation is performed, states of data stored in one or more other memory blocks excluding the memory block among the plurality of memory blocks are retained.

8. An operating method for a data storage device, comprising:
   determining whether a read count value of a memory region included in a storage medium exceeds a threshold count value; and
   whenever a read request for the memory region is received from an external device, writing read-requested data stored in the memory region to another memory region included in the storage medium while leaving the other data stored in the memory region as is, after the read count value is determined to exceed the threshold count value.

9. The operating method of claim 8, further comprising reading data stored in the another memory region, in order to process a subsequent read request for the read-requested data.

10. The operating method of claim 8, further comprising invalidating the read-requested data stored in the memory region, after the writing of the read-requested data to the another memory region.

11. The operating method of claim 10, wherein the states of the other data stored in the memory region are retained when the read-requested data stored in the memory region is invalidated.

12. The operating method of claim 8, further comprising:
   reading the read-requested data from the memory region in response to the read request;
   storing the read data in a data buffer;
   transmitting the data stored in the data buffer to the external device.

13. The operating method of claim 12, wherein the writing of the read-requested data to the another memory region comprises writing the data stored in the data buffer to the another memory region.

14. The operating method of claim 8, further comprising increasing the read count value in response to the read request.

15. A data storage device comprising:
   a storage medium comprising a plurality of memory regions; and
   a controller suitable for reading original data stored in a memory region of the storage medium in response to a read request received from an external device, increasing a read count value of the memory region, determining whether the read count value exceeds a threshold count value, and invalidating the original data among data stored in the memory region while leaving the other data stored in the memory region as is, depending on the determination result.

16. The data storage device of claim 15, wherein the controller, depending on the determination result, invalidates valid data stored in the memory region after receiving a read request indicating a read operation for the valid data from the external device.

17. The data storage device of claim 15, wherein the controller writes data read from the original data to another memory region of the storage medium, depending on the determination result.

18. The data storage device of claim 15, wherein the controller transmits data read from the original data to the external device in response to the read request.

* * * * *